(12) United States Patent
Fujimoto et al.

(10) Patent No.: US 8,564,130 B2
(45) Date of Patent: Oct. 22, 2013

(54) VERTICAL ORGANIC TRANSISTOR, METHOD FOR MANUFACTURING THE VERTICAL ORGANIC TRANSISTOR, AND LIGHT EMITTING ELEMENT

(75) Inventors: Shinya Fujimoto, Abiko (JP); Hiroki Maeda, Tokyo-To (JP); Yoshiaki Tsuruoka, Saitama (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 582 days.

(21) Appl. No.: 12/675,830

(22) PCT Filed: Sep. 1, 2008

(86) PCT No.: PCT/JP2008/065666
§ 371 (c)(1),
(2), (4) Date: May 5, 2010

(87) PCT Pub. No.: WO2009/028706
PCT Pub. Date: Mar. 5, 2009

(65) Prior Publication Data
US 2010/0213447 A1  Aug. 26, 2010

(30) Foreign Application Priority Data

Aug. 31, 2007 (JP) .................................. 2007-226664
Aug. 25, 2008 (JP) .................................. 2008-215068

(51) Int. Cl.
*H01L 23/48* (2006.01)

(52) U.S. Cl.
USPC ..................... 257/746; 257/9; 257/E51.003

(58) Field of Classification Search
USPC ......... 438/99; 257/E51.003, 746, 9; 977/932; 252/510; 361/523
See application file for complete search history.

(56) References Cited

U.S. PATENT DOCUMENTS

| | | | |
|---|---|---|---|
| 2005/0123751 A1* | 6/2005 | Tsutsui et al. | 428/364 |
| 2005/0202587 A1 | 9/2005 | Redecker et al. | |
| 2005/0218412 A1 | 10/2005 | Kido et al. | |
| 2006/0145144 A1 | 7/2006 | Lee et al. | |
| 2006/0157772 A1* | 7/2006 | Sumida et al. | 257/314 |
| 2006/0208251 A1* | 9/2006 | Yoshizawa | 257/40 |
| 2007/0252130 A1* | 11/2007 | Yang et al. | 257/9 |
| 2007/0252136 A1* | 11/2007 | Lieber et al. | 257/24 |

FOREIGN PATENT DOCUMENTS

| | | | |
|---|---|---|---|
| JP | 2003-324203 A1 | 11/2003 | |
| JP | 2004-327615 A1 | 11/2004 | |
| JP | 2005-243871 A1 | 9/2005 | |
| JP | 2005-260206 A1 | 9/2005 | |

(Continued)

OTHER PUBLICATIONS

Kazuhiro Kudo, "*Recent Progress and Future Trend of Organic Transistors*," Oyo Buturi, 2003, vol. 72, No. 9, pp. 1151-1156.

(Continued)

*Primary Examiner* — Caridad Everhart
(74) *Attorney, Agent, or Firm* — Burr & Brown

(57) ABSTRACT

This invention provides a vertical organic transistor that can realize large current modulation and a reduction in production cost, and a method for manufacturing the vertical organic transistor. The vertical organic transistor comprises an upper electrode, a lower electrode, an organic semiconductor provided between both the electrodes, and an intermediate electrode provided within the organic semiconductor, the intermediate electrode being a layered continuous body comprising a continuous insulating metal compound and particulate metals distributed within the insulating metal compound.

19 Claims, 8 Drawing Sheets

(56) References Cited

FOREIGN PATENT DOCUMENTS

| | | |
|---|---|---|
| JP | 2005-293980 A1 | 10/2005 |
| JP | 2006-191044 A1 | 7/2006 |
| JP | 2007-027566 A1 | 2/2007 |

OTHER PUBLICATIONS

Satoru Toguchi, et al., "*Improvement of Switching Property in Organic Static Induction Transistors*," Extended Abstracts, The 53rd Spring Meeting, 2006, The Japan Society of Applied Physics and Related Societies, 23a-ZG-3, p. 1412.

\* cited by examiner

VERTICAL ORGANIC TRANSISTOR, METHOD FOR MANUFACTURING THE VERTICAL ORGANIC TRANSISTOR, AND LIGHT EMITTING ELEMENT

CROSS-REFERENCE TO RELATED APPLICATIONS

This application is based upon and claims the benefit of priority under Article 4 of the Paris Convention from the prior Japanese Patent Applications No. 226664/2007, filed on Aug. 31, 2007 and No. 215068/2008, filed on Aug. 25, 2008, the entire contents of the specifications of which are incorporated herein by reference.

FIELD OF INVENTION

The present invention relates to a vertical organic transistor, a method for manufacturing the vertical organic transistor, and a light emitting element. More particularly, the present invention relates to a vertical organic transistor that can realize large current modulation and lowered production cost, a method for manufacturing the vertical organic transistor, and a light emitting element comprising a vertical organic transistor.

BACKGROUND ART

Organic field effect transistors (OFETs) have features such as low cost and good flexibility because organic transistors can be manufactured by a coating process such as printing. Accordingly, organic field effect transistors are expected to find new applications different from applications of conventional Si transistors, for example, flexible displays and RFID (radio frequency identification) in which information is transmitted and received by near field communication, for example, using electromagnetic fields and electric waves. Organic semiconductors used in organic field effect transistors, however, have low carrier mobility and thus suffer from problems such as small current modulation and low response speed.

In order to solve these problems, vertical organic transistors have been proposed. The vertical organic transistors have a laminated structure comprising a collector electrode and an emitter electrode as upper and lower electrodes, an organic semiconductor held between the collector electrode and the emitter electrode, and an intermediate electrode provided within the organic semiconductor. The laminated structure has advantages, for example, shortening of channel length carried by the organic semiconductors, for example, to not more than 1 μm, high-speed response and enhanced power by virtue of effective utilization of the whole electrode surface, and lowered susceptibility to the influence of the interface. Accordingly, high-speed response at a low voltage can be realized even when an organic semiconductor having low carrier mobility is used.

In the vertical organic transistor, upon the application of a fixed voltage across the emitter electrode and the collector electrode that are provided respectively as opposed upper and lower electrodes while holding the organic semiconductor therebetween, current hardly flows between the emitter electrode and the collector electrode when voltage is not applied across the emitter electrode and a base electrode provided within the organic semiconductor, whereas, when voltage is applied across the emitter electrode and the base electrode, the amount of current which flows across the emitter electrode and the collector electrode is significantly increased to allow the current to be modulated.

As described, for example, in patent documents 1 to 4 "Japanese Patent Application Laid-Open No. 327615/2004, Japanese Patent Application Laid-Open No. 27566/2007, Japanese Patent Application Laid-Open No, 243871/2005, and Japanese Patent Application Laid-Open No. 324203/2003 [Claim 1]" and non-patent document 1 (Kudo Kazuhiro, "Recent progress and future trend of organic transistors", OYO BUTURI, Vol. 72, No. 9, p. 1151-1156 (2003)), the conventional vertical organic transistor comprises an organic semiconductor and striped (meshed) intermediate electrodes (which act as the base electrode) inserted into the organic semiconductor. In these embodiments, the organic semiconductor is in contact with both the emitter electrode and the collector electrode and also exists in "opening" between the striped intermediate electrodes. Accordingly, current which flows through the opening defined by the organic semiconductor is modulated by applying voltage across the emitter electrode and the intermediate electrode.

For example, in the patent documents described above, the pitch (stripe pitch) of the striped intermediate electrodes provided at given intervals in the lateral direction is large and several tens of micrometers, and the width of the organic semiconductor present in the opening between the intermediate electrodes is also large and several tens of micrometers. Therefore, the area influenced by the voltage applied between the emitter electrode and the intermediate electrode is disadvantageously limited to a part around the edge of the striped intermediate electrodes. In order to effectively modulate the current which flows through the whole area of the opening defined by the organic semiconductor from the viewpoint of overcoming the problem, it is reported that reducing the spacing between the striped intermediate electrodes (for example, to about 100 nm) is effective (non-patent document 2: Satoru Toguchi, et al.; "Extended abstracts (The 53rd Spring Meeting, 2006); The Japan Society of Applied Physics and Related Societies", 23a-ZG-3, p. 1412 (2006)).

In non-patent document 2, however, the fine pattern of the intermediate electrode is formed using microfabrication means such as electron beam lithography. Accordingly, the cost incurred in the manufacture of the vertical organic transistor is increased, and, thus, the technique disclosed in non-patent document 2 is not practical. The problem leads to the loss of the advantage of the vertical organic transistor that the channel length can be reduced by a simple manufacturing method.

SUMMARY OF THE INVENTION

The present invention has been made with a view to solving the above problems of the prior art, and an object of the present invention is to provide a vertical organic transistor that can realize large current modulation and lowered production cost, and a method for manufacturing the vertical organic transistor. Another object of the present invention is to provide a light emitting element comprising the vertical organic transistor.

The above object can be attained by a vertical organic transistor comprising an upper electrode, a lower electrode, an organic semiconductor provided between both the electrodes, and a layered continuous body provided within the organic semiconductor, characterized in that the layered continuous body comprises a continuous insulating metal compound and particulate metals distributed within the insulating metal compound.

According to the present invention, the layered continuous body comprises a continuous insulating metal compound and particulate metals distributed within the insulating metal compound. Therefore, unlike the "opening" formed of the organic semiconductor in the prior art technique, in the present invention, the opening is formed of an insulating metal compound, and, unlike the "intermediate electrode (base electrode)" formed of the pattern etched metal layer, in the present invention, the intermediate electrode (base electrode) is formed of particulate metals. In the layered continuous body in the above form, the part of the insulating metal compound other than the particulate metals (i.e., the part corresponding to the "opening") functions as a transparent part for the current which flows across the upper electrode and the lower electrode while the particulate metals function as the base electrode. The layered continuous body can easily be formed by producing an insulating metal compound in a chemical reaction after the formation of a thin metal film. Therefore, according to the present invention, the layered continuous body is configured in such a form that the insulating metal compound is present around the particulate metals. Thus, the transparent part comprising the insulating metal compound that functions as an opening is in a fine form unlike an large-width opening in the prior art technique. Consequently, even when the area influenced by voltage applied between the emitter electrode and the base electrode (particulate metals) is limited to the part around the edge of the base electrode (particulate metals), current which flows across the upper electrode and the lower electrode can be efficiently modulated. Further, the layered continuous body can easily be formed, and, thus, the manufacturing cost can be lowered.

In a preferred embodiment of the vertical organic transistor according to the present invention, the average diameter of the particulate metals is not less than 5 nm and not more than 200 nm.

According to the present invention, the average diameter of the particulate metals is much smaller than the width of the metal layer as the base electrode in the prior art technique, and, thus, the insulating metal compound that is produced around the particulate metals and functions as the current transparent part can be formed in a larger amount (at a higher density) within the layered continuous body. Thus, as with the above case, even when the area influenced by voltage applied between the emitter electrode and the base electrode (particulate metals) is limited to the part around the edge of the base electrode (particulate metals), current which flows across the upper electrode and the lower electrode can be efficiently modulated.

In a preferred embodiment of the vertical organic transistor according to the present invention, the insulating metal compound is an oxide of the same metal as the particulate metals.

According to the present invention, the metal component constituting the insulating metal compound is the same as the metal component constituting the particulate metals. Therefore, the insulating metal compound constituting the layered continuous body can easily be produced, for example, by forming a thin metal film and then introducing a reactive gas such as oxygen to chemically react the metal with the reactive gas.

In a preferred embodiment of the vertical organic transistor according to the present invention, the particulate metal is particulate aluminum or particulate copper.

In a preferred embodiment of the vertical organic transistor according to the present invention, the organic semiconductor comprises a lower organic semiconductor layer located between the intermediate electrode and the lower electrode and an upper organic semiconductor layer located between the intermediate electrode and the upper electrode.

According to the present invention, the layered continuous body is provided within the organic semiconductor, and, thus, the organic semiconductor comprises a lower organic semiconductor layer and an upper organic semiconductor layer. Accordingly, for example, the lower organic semiconductor layer and the upper organic semiconductor layer can be formed with respective different organic semiconductor materials. The lower organic semiconductor layer and the upper organic semiconductor layer are formed of at least one (one or more) materials.

In a preferred embodiment of the vertical organic transistor according to the present invention, the vertical organic transistor can be configured so that (1) a bus line is provided on the intermediate electrode, (2) the bus line is provided at a site where the intermediate electrode does not overlap with the lower electrode or the upper electrode in a plane view, (3) a bus line is provided on the upper electrode, and (4) the bus line is provided at a site where the upper electrode does not overlap with the lower electrode or the intermediate electrode in a plane view. The bus lines are preferably formed of one or two materials selected from the group consisting of metals, oxide semiconductors and electroconductive polymers.

According to the present invention, a bus line having good electroconductivity is provided on the intermediate electrode and the upper electrode that are very thin and have higher electric resistance than the conventional metal. This configuration can prevent voltage drop and can suppress lowered current modulating properties. Further, when the spacing between the bus line provided on the intermediate electrode or the upper electrode and the other electrodes is, for example, about 20 μm, current passed through the bus line does not leak into the other electrodes.

In order to attain the above object, according to another aspect of the present invention, there is provided a method for manufacturing a vertical organic transistor, the vertical organic transistor comprising an upper electrode, a lower electrode, an organic semiconductor provided between both the electrodes, and a layered continuous body provided within the organic semiconductor, the organic semiconductor comprising an upper organic semiconductor layer on the upper electrode side and a lower organic semiconductor layer on the lower electrode side, the method being characterized by comprising the steps of: forming the lower organic semiconductor-layer on a substrate with the lower electrode formed thereon; forming a layered continuous body on the lower organic semiconductor layer, the layered continuous body comprising a continuous insulating metal compound and particulate metals distributed within the insulating metal compound; forming the upper organic semiconductor layer on the layered continuous body; and forming the upper electrode on the upper organic semiconductor layer.

The method according to the present invention comprises the step of forming the layered continuous body on the lower organic semiconductor layer. In the layered continuous body formed in this step, the part formed of the particulate metals functions as the pattern etched intermediate electrode (base electrode) in the prior art technique, and the part formed of the insulating metal compound where the particulate metals are not present functions as the opening in the prior art technique. In the layered continuous body in this form, the insulating metal compound part which functions as the opening is a transparent part for current which flows across the upper electrode and the lower electrode. The layered continuous body can easily be formed, for example, by a chemical reaction or the like after thin metal film formation to produce an insulating metal compound. Accordingly, the manufacturing cost of the vertical organic transistor can be lowered.

In a preferred embodiment of the method for manufacturing the vertical organic transistor according to the present invention, the step of forming the layered continuous body comprises: a metal film forming step of forming a metal film on the whole area of the top of the lower organic semiconductor layer; and a partially insulating step of partially insulating the metal film to produce a continuous insulating metal compound and particulate metals distributed within the insulating metal compound.

According to the present invention, the step of forming the layered continuous body comprises the metal film forming step and the partially insulating step. Accordingly, the layered continuous body after the step of forming the layered continuous body comprises the continuous insulating metal compound and the particulate metals distributed within the insulating metal compound. As with the above case, the layered continuous body in this form can easily be formed, for example, by a chemical reaction or the like after metal film formation to produce an insulating metal compound. Accordingly, the manufacturing cost of the vertical organic transistor can be lowered.

In a preferred embodiment of the method for manufacturing the vertical organic transistor according to the present invention, the metal film is configured to be formed of an aggregate of metallic particles having a diameter of not less than 5 nm and not more than 200 nm.

According to the present invention, since the metal film is formed as the aggregate of the metallic particles having a predetermined diameter, the periphery of the metallic particles has a small film thickness, and the metal can easily be converted to an insulating metal compound, for example, by a chemical reaction or the like. Consequently, the transparent part for current which flows across the upper electrode and the lower electrode can easily formed, and, thus, the manufacturing cost of the vertical organic transistor can be lowered.

In a preferred embodiment of the method for manufacturing the vertical organic transistor according to the present invention, the partially insulating step is carried out until the average diameter of the particulate metals reaches not less than 5 nm and not more than 200 nm.

According to the present invention, since the average diameter of the particulate metals is brought to not less than 5 nm and not more than 200 nm by the partially insulating step, the average diameter of the particulate metals can be rendered much smaller than the width of the metal layer as the base electrode in the prior art technique. Consequently, the insulating metal compound which is produced around the particulate metals and functions as the current transparent part can easily be formed in a larger amount (at higher density) within the layered continuous body.

In a preferred embodiment of the method for manufacturing the vertical organic transistor according to the present invention, the partially insulating step is the step of oxidation in an oxygen atmosphere.

According to the present invention, when the partially insulating step is the step of oxidation in an oxygen atmosphere, the insulating metal oxide can easily be formed around the particulate metals and the insulating metal compound can be allowed to function as the current transparent part.

In a preferred embodiment of the method for manufacturing the vertical organic transistor according to the present invention, the method may be configured so that (1) the method comprises a bus line forming step of forming a bus line connected to the intermediate electrode on the substrate at its position where the intermediate electrode does not overlap with the lower electrode or the upper electrode in a plane view and (2) the method comprises a bus line forming step of forming a bus line connected to the upper electrode on the substrate at its position where the upper electrode does not overlap with the lower electrode or the intermediate electrode in a plane view. In these bus line forming steps, preferably, the bus line is formed of any material selected from metals, oxide semiconductors, and electroconductive polymers.

In order to attain the above object, according to a further aspect of the present invention, there is provided a light emitting element characterized by comprising: the vertical organic transistor of the present invention; and a light emitting element part comprising an organic light emitting layer provided between the upper electrode and the lower electrode that constitute the vertical organic transistor.

According to the present invention, since the light emitting element comprises the vertical organic transistor that can significantly modulate the amount of current which flows across the emitter electrode (upper electrode) and the collector electrode (lower electrode). The modulated current can be applied as a light emitting current to the organic light emitting layer between the emitter electrode (upper electrode) and the collector electrode (lower electrode). As a result, the controllability of the luminescence brightness and the like in the organic light emitting layer can be enhanced, and, at the same time, the cost can be lowered.

In a preferred embodiment of the light emitting element according to the present invention, the light emitting element is configured so that the light emitting element part comprises one or more layers selected from a hole transport layer, an electron transport layer, a hole injection layer, and an electron injection layer, and the organic light emitting layer is an organic EL layer.

According to the vertical organic transistor of the present invention, the layered continuous body is configured so that the insulating metal compound is present around the particulate metals. Therefore, the transparent part formed of the insulating metal compound corresponding to a part which functions as the opening in the prior art technique is not in a large-width opening form as in the prior art technique but is in a fine form. As a result, even when the area influenced by voltage applied between the emitter electrode and the base electrode (particulate metals) is limited to the part around the edge of the base electrode (particulate metals), current which flows across the upper electrode and the lower electrode can be efficiently modulated.

In the method for manufacturing a vertical organic transistor according to the present invention, the insulating metal compound part which functions as the opening functions as a transparent part for current which flows across the upper electrode and the lower electrode. Accordingly, the insulating metal compound in the layered continuous body can easily be produced, for example, by a chemical reaction or the like after the thin metal film formation. Consequently, the manufacturing cost of the vertical organic transistor can be lowered.

Since the light emitting element according to the present invention comprises the vertical organic transistor according to the present invention, the modulated current can be applied as a light emitting current to the organic light emitting layer between the emitter electrode (upper electrode) and the collector electrode (lower electrode). As a result, the controllability of the luminescence brightness and the like in the organic light emitting layer can be enhanced, and, at the same time, the cost of the whole light emitting element can be lowered.

BRIEF DESCRIPTION THE DRAWING

DESCRIPTION OF REFERENCE CHARACTERS

1: emitter electrode (upper electrode),
2: collector electrode (lower electrode),
3: organic semiconductor,
3a: upper organic semiconductor layer,
3b: lower organic semiconductor layer,
4: layered continuous body,
4a: particulate metals,
4b: insulating metal compound,
4': metal film,
4": metallic particles,
5a, 5b: bus line,
6a, 6b: contact part,
10: substrate,
11: vertical organic transistor,
21: light emitting element,
22: light emitting element part,
23: hole injection layer,
24: hole transport layer,
25: organic light emitting layer, and
A: operating area

DETAILED DESCRIPTION OF THE INVENTION

The vertical organic transistor, the method for manufacturing the vertical organic transistor, and the light emitting element according to the present invention will be described in more detail with reference to the accompanying drawings. In the present invention, various variations are possible so long as they have the technical feature of the present invention, and the present invention is not limited to the following specific embodiments.

[Vertical Organic Transistor]

(Whole Construction)

Figure 1:
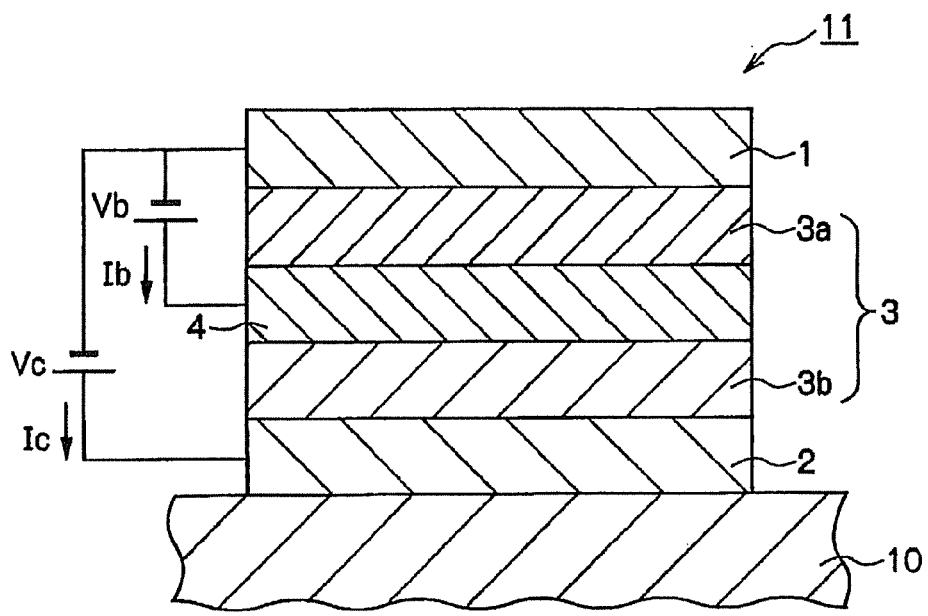
FIG. 1 is a typical cross-sectional view showing the configuration of one embodiment of a vertical organic transistor according to the present invention.
Figure 2:
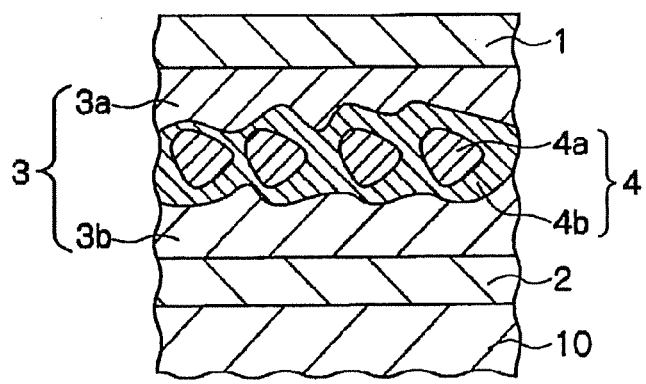
FIG. 2 is a typical detailed cross-sectional view showing a layered continuous body.

FIG. 1 is a typical cross-sectional view showing the configuration of one embodiment of the vertical organic transistor according to the present invention, and FIG. 2 a typical detailed cross-sectional view showing a layered continuous body. As shown in FIG. 1, a vertical organic transistor 11 according to the present invention comprises an upper electrode 1, a lower electrode 2, and an organic semiconductor 3 provided between both the electrodes 1, 2, and a layered continuous body 4 provided within the organic semiconductor 3. As shown in FIG. 2, the layered continuous body 4 comprises a continuous insulating metal compound 4b and particulate metals 4a distributed within the insulating metal to compound 4b. The organic semiconductor 3 specifically comprises a charge transport upper organic semiconductor layer 3a provided between the upper electrode 1 and the layered continuous body 4 and a charge transport lower organic semiconductor layer 3b provided between the lower electrode 2 and the layered continuous body 4.

In the vertical organic transistor according to the present invention, the upper electrode 1 functions as an emitter electrode or a collector electrode, the lower electrode 2 opposed to the upper electrode 1 functions as a collector electrode or an emitter electrode, and the particulate metals 4a provided within the layered continuous body 4 function as a base electrode. In the following description, the lower electrode 2 provided on a substrate 10 will be described as a collector electrode, the upper electrode 1 will be described as an emitter electrode, and the particulate metals 4a will be if necessary described as a base electrode.

Further, in FIG. 1, reference character Ic designates current (collector current) which flows upon the application of a collector voltage Vc across the emitter electrode 1 and the collector electrode 2, reference character Ib current (base current) which flows upon the application of a base voltage Vb across the emitter electrode 1 and the base electrode 4a. In the vertical organic transistor 11 according to the present invention, when the collector voltage Vc is applied between the emitter electrode 1 and the collector electrode 2 while the base voltage Vb is applied between the emitter electrode 1 and the base electrode 4a, electrons injected from the emitter electrode 1 are significantly accelerated by the action of the base voltage Vb, are passed through the insulating metal compound 4b in the layered continuous body 4, and reach the collector electrode 2. Specifically, current Ic which flows across the emitter electrode and the collector electrode can be modified by applying the base voltage Vb. Accordingly, according to the vertical organic transistor 11, current modulation comparable with that in the conventional transistor can be stably provided.

Constituent elements of the vertical organic transistor according to the present invention will be described in sequence.

(Emitter Electrode and Collector Electrode)

As described in FIG. 1, the emitter electrode (upper electrode) 1 and the collector electrode (lower electrode) 2 are disposed so as to hold the organic semiconductor 3 therebetween. In the embodiment shown in FIG. 1, the collector electrode 2 is provided on the substrate 10, and the emitter electrode 1 is provided at a position which is located in the upper part and opposed to the collector electrode 2. Materials for constituting the emitter electrode 1 and the collector electrode 2 include thin films of metals, conductive oxides, electroconductive polymers and the like. When the emitter electrode 1 or the collector electrode 2 are provided on the substrate 10, for example, a barrier layer or a smoothing layer (not shown) may be provided between the emitter electrode 1 and the collector electrode 2.

Materials usable for the formation of the collector electrode 2 include, for example, transparent electroconductive films of ITO (indium tin oxide), indium oxide, IZO (indium zinc oxide), $SnO_2$, ZnO and the like, and films of electroconductive polymers such as polyaniline, polyacetylene, polyalkylthiophene derivatives, and polysilane derivatives. On the other hand, when the organic semiconductor 3 is formed of an electron transport organic compound which will be described later, materials usable for the formation of the emitter electrode 1 include metals having a small work function, for example, elementary metals such as aluminum and silver, magnesium alloys such as MgAg, aluminum alloys such as AlLi, AlCa, and AlMg, alkali metals including Li and Ca, and alloys of the alkali metals. When the organic semiconductor 3 is formed of a hole transport organic compound which will be described later, metals having a large work function such as gold and chromium are used as the material for the emitter.

(Organic Semiconductor)

The organic semiconductor 3 is provided in a layer form held between the emitter electrode 1 and the collector electrode 2. The organic semiconductor 3 comprises a lower organic semiconductor layer 3b provided between the collector electrode 2 and the layered continuous body 4 and an upper organic semiconductor layer 3a provided between the layered continuous body 4 and the emitter electrode 1.

The upper organic semiconductor layer 3a and the lower organic semiconductor layer 3b may be formed of various charge transport organic semiconductor materials, for example, in such a manner that (i) the upper organic semiconductor layer 3a and the lower organic semiconductor layer 3b may be formed of one or more identical materials or formed of one or more different materials, (ii) the materials may be a hole transport material or an electron transport material, (iii) the thickness of the upper organic semiconductor layer 3a and the thickness of the lower organic semiconductor layer 3b may be the same or different, and (iv) a charge injection layer (not shown) may be provided between the organic semiconductor 3 and the emitter electrode 1 or the collector electrode 2.

When the electrode (emitter electrode 1 or collector electrode 2) is provided on the organic semiconductor 3, a protective layer (not shown) may be provided on the organic semiconductor 3 from the viewpoint of reducing damage to the organic semiconductor 3 in the formation of the electrode. Preferably, for example, a vapor deposited film or a sputtered film formed of a metal film such as a Au, Ag, or Al film or an inorganic semiconductor film such as a ZnS or ZnSe film which is less likely to cause damage in the film formation is previously formed as the protective layer to a thickness of about 1 to 500 nm.

Preferred materials usable for the formation of the organic semiconductor 3 include, for example, $Alq_3$ (tris(8-quinolinolato)aluminum complex) and n-type organic semiconductors, for example, perylene pigments (Me-PTC), fullerene C60, NTCDA (naphthalene tetracarboxylic acid dianhydride), PTCDA (3,4,9,10-perylene tetracarboxylic acid dianhydride), or Ph-Et-PTC. In addition, materials commonly used as charge transport materials, for example, anthraquinodimethane, fluorenylidenemethane, tetracyanoethylene, fluorenone, diphenoquinone oxadiazole, anthrone, thiopyrandioxide, diphenoquinone, benzoquinone, malononitrile, dinitrobenzene, nitroanthraquinone, maleic acid anhydride, or perylene tetracarboxylic acid, or their derivatives may also be used.

The charge mobility of the organic semiconductor 3 is preferably as high as possible and is preferably not less than 0.001 $cm^2$/Vs.

The thickness of the lower organic semiconductor layer 3b is generally approximately 10 nm to 3 μm, preferably approximately 50 nm to 700 nm. When the thickness of the lower organic semiconductor layer 3b is less than 10 nm or exceeds 3 μm, the transistor sometimes does not operate. On the other hand, preferably, the thickness of the upper organic semiconductor layer 3a is basically smaller than the thickness of the lower organic semiconductor layer 3b. The thickness of the upper organic semiconductor layer 3a is generally approximately not more than 500 nm, preferably approximately 10 nm to 150 nm. A thickness of less than 10 nm poses a problem of continuity, sometimes resulting in lowered yield.

For example, a silicon oxide film may be provided between the organic semiconductor layer 3b and the layered continuous body 4 or on both sides of the layered continuous body 4 from the viewpoint of suppressing leak current.

(Layered Continuous Body)

As shown in FIG. 2, the layered continuous body 4 comprises particulate metals 4a and an insulating metal compound 4b provided so that the particulate metals 4a are present within the layered continuous body 4. In other words, the layered continuous body 4 is configured to comprise the continuous insulating metal compound 4b and the particulate metals 4a distributed within the insulating metal compound 4b.

The particulate metals 4a are metals distributed in a particle form in a lateral direction of the layered continuous body 4 and function as a base electrode that forcibly supplies charges supplied from the emitter electrode 1 into the lower organic semiconductor layer 3b located on the collector electrode 2 side. The particulate metals 4a may be in any form without particular limitation but are generally in a circular, substantially circular (including elliptical or the like) or similar form. When the particulate metals 4a are in a circular or substantially circular form, the average diameter of the particulate metals 4a is preferably not less than 5 nm and not more than 200 nm, more preferably not less than 10 nm and not more than 100 nm, particularly preferably not less than 30 nm and not more than 50 nm. The size of the particulate metals 4a defined above is much smaller than the width of the metal layer which functions as the base electrode in the prior art technique. Accordingly, the insulating metal compound 4b which is provided around the particulate metals 4a and functions as the current transparent part can be produced in a larger amount (at higher density) within the layered continuous body 4. As a result, even when the area influenced by voltage Vb applied between the emitter electrode 1 and the base electrode (particulate metals 4a) is limited to a part around the edge of the base electrode (particulate metals 4a), current Ic which flows across the emitter electrode 1 (upper electrode) and the collector electrode 2 (lower electrode) can be efficiently modulated.

When the average diameter of the particulate metals 4a is less than 5 nm, the particulate metals 4a are so small that the surface resistance is increased and the particulate metals 4a do not sometimes function as the electrode. On the other hand, when the average diameter of the particulate metals 4a exceeds 500 nm, the size of the opening is relatively reduced and approaches the size of the opening in the metal layer in the prior art technique. This disadvantageously sometimes causes a problem that the passage of current is inhibited.

The thickness of the particulate metals 4a is not particularly limited. For example, the thickness of the particulate metals 4a is approximately 5 nm to 100 nm, preferably approximately 10 nm to 40 nm. As explained in the column of "Manufacturing method" which will be described later, when a metal film 4' formed of metallic particles 4" having predetermined particle diameters (see FIG. 6 (A)) is converted to particulate metals 4a by a chemical reaction such as oxidation, the thickness of the particulate metals 4a is preferably approximately 2 nm to 50 nm, more preferably approximately 5 nm to 20 nm. The particulate metals 4a having the above thickness can be distributed in a particle form in the lateral direction of the layered continuous body 4.

The particulate metals 4a distributed within the layered continuous body 4 are generally distributed within the layered continuous body 4 in a form derived from the manufacturing method which will be described later, that is, are arranged in the lateral direction of the layered continuous body 4 but are not vertically stacked on top of each other. However, it should be noted that the form of the presence of the particulate metals 4a is not limited to the above form, and the particulate metals 4a may also be vertically stacked on top of each other.

Any electroconductive metal may be used as the material for the particulate metals 4a without particular limitation. Preferably, however, for example, aluminum or copper having good electroconductivity is adopted. In particular, aluminum can easily be converted by an oxidation reaction to aluminum oxide which conveniently functions as the insulating metal compound 4b. Further, aluminum oxide is advantageous in that the oxidation reaction stops when the oxidation proceeds to a certain extent. Accordingly, in this case, the sire of the particulate metals 4a and the thickness of the insulating metal compounds 4b can be advantageously regulated to approximately not more than 10 nm.

As is also apparent from one embodiment shown in FIG. 8 which will be described later, the insulating metal compound 4b is provided in a layer form, in the lateral direction of the layered continuous body 4, in such a form that the particulate metals 4a are present within the insulating metal compound 4b. Specifically, the insulating metal compound 4b is provided so as to surround the whole particulate metals 4a and evenly in a layer form in the lateral direction of the layered continuous body 4.

Examples of the insulating metal compound 4b include, for example, aluminum oxide, aluminum oxynitride, and copper oxide. The metal constituting the insulating metal compound 4b is not particularly limited, but is generally the same as the metal constituting the particulate metals 4a. Accordingly, in this case, for example, when the particulate metals 4a is formed of aluminum, the insulating metal compound 4b is formed of an aluminum compound (for example, aluminum oxide). The insulating metal compound 4b is particularly preferably formed of an oxide or an oxynitride of the metal constituting the particulate metals 4a or formed of a composite compound thereof. In this case, since the metal component constituting the insulating metal compound 4b is the same as the metal component constituting the particulate metals 4a, the insulating metal compound 4b constituting the layered continuous body 4 can easily be produced, for example, by introducing a reactive gas such as oxygen or nitrogen after the formation of a thin metal film to chemically react the metal with the reactive gas.

The thickness of the insulating metal compound 4b is not particularly limited. When the insulating metal compound 4b is produced, for example, by oxidation of the metal film 4' formed of the metallic particles 4", however, the thickness of the insulating metal compound 4b should be at least such that the particulate metals 4a necessarily remains at a predetermined size. For example, the thickness of the insulating metal compound 4b is approximately 0.1 nm to 100 nm, preferably 1 nm to 10 nm. The thickness in this case refers to at least the thickness of the insulating metal compound 4b formed around the particulate metals 4a. When the thickness of the insulating metal compound 4b is less than 0.1 nm, for example, the current transparent part formed of the insulating metal compound 4b produced between adjacent particulate metals 4a, 4a is so small that current which flows across the emitter electrode and the collector electrode sometimes cannot be efficiently passed through the insulating metal compound 4b. On the other hand, when the thickness of the insulating metal compound 4b exceeds 100 nm, for example, the current transparent part formed of the insulating metal compound 4b produced between adjacent particulate metals 4a, 4a is so wide that the problem of the prior art technique that the area influenced by voltage applied between the emitter electrode and the particulate metals 4a (base electrode) is limited to the part around the edge of the particulate metals 4a remains unsolved. Further, in this case, the spacing between the particulate metals 4a, 4a is so large that the layered continuous body 4 has poor electroconductivity and, consequently, the particulate metals 4a per se do not sometimes function as the base electrode.

As described above, the particulate metals 4a distributed within the insulating metal compound 4b may be or may not be distributed in such a form that the metal parts are not in contact with and connected to each other. The particulate metals 4a may be distributed in such a manner that the metal parts are in contact with and connected to each other. When the metal parts are in contact with each other, current flows across the particulate metals 4a, 4a and, consequently, electroconductivity can be ensured. On the other hand, when the metal parts are not in contact with each other, if the width of the insulating metal compound 4b as the current transparent part which is present around the particulate metals 4a and between the particulate metals 4a, 4a (spacing between adjacent particulate metals 4a, 4a) is in the above-defined thickness range, for example, tunnel current flows across the particulate metals 4a, 4a and, consequently, electroconductivity as the electrode can be ensured.

As described above, according to the vertical organic transistor 10 of the present invention, the layered continuous body 4 is configured so as to comprise the continuous insulating metal compound 4b and the particulate metals 4a distributed within the insulating metal compound 4b. Therefore, unlike the "opening" formed of the organic semiconductor in the prior art technique, in the present invention, the opening is formed of the insulating metal compound 4b, and, unlike the "intermediate electrode (base electrode)" formed of the pattern etched metal layer, in the present invention, the intermediate electrode (base electrode) is formed of the particulate metals 4a. The layered continuous body 4 in the above form in its part other than the particulate metals 4a, that is, the part of the insulating metal compound 4b (the part corresponding to the "opening") functions as a transparent part for current which flows across the emitter electrode 1 (upper electrode) and the collector electrode 2 (lower electrode), and the particulate metals 4a function as the base electrode. As explained in the column of "Manufacturing method" which will be described later, the insulating metal compound in the layered continuous body 4 can easily be produced by a chemical reaction after the formation of a thin metal film. Therefore, according to the vertical organic transistor 11 of the present invention, since the layered continuous body 4 is configured in such a form that the insulating metal compound 4b is present around the particulate metals 4a, the current transparent part formed of the insulating metal compound 4b corresponding to the opening in the prior art technique is not wide unlike the opening in the prior art technique but is in a fine form. As a result, even when the area influenced by voltage Vb applied between the emitter electrode 1 and the base electrode (particulate metals 4a) is limited to the part around the edge of the base electrode (particulate metals 4a), current Ic which flows across the emitter electrode 1 (upper electrode) and the collector electrode 2 (lower electrode) can be efficiently modified. Further, the layered continuous body 4 can easily be formed, and, thus, the manufacturing cost can also be lowered.

(Bus Line)

Figure 3:
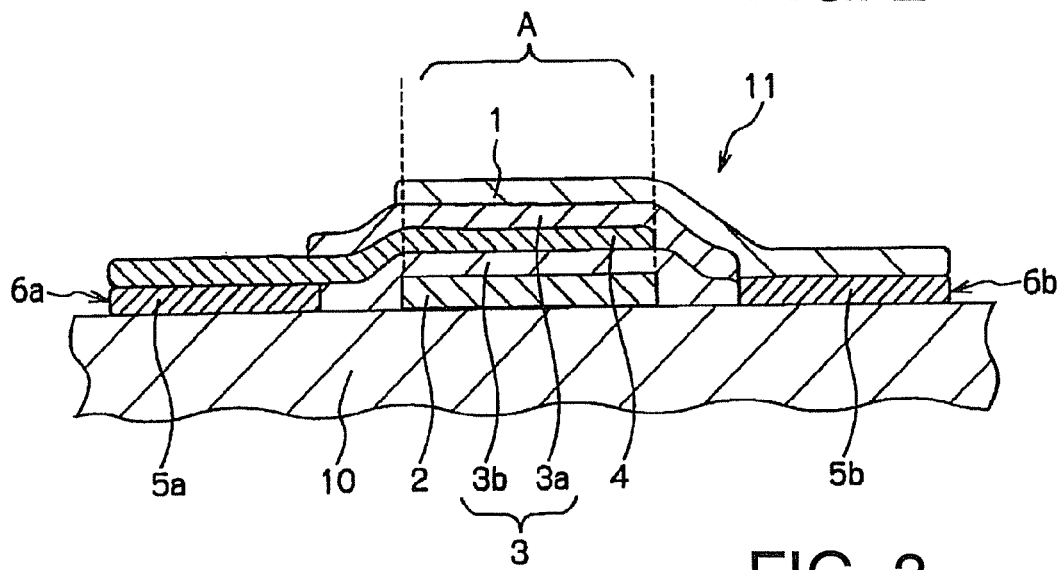
FIG. 3 is a cross-sectional view showing one embodiment of a vertical organic transistor with bus lines provided therein.
Figure 4:
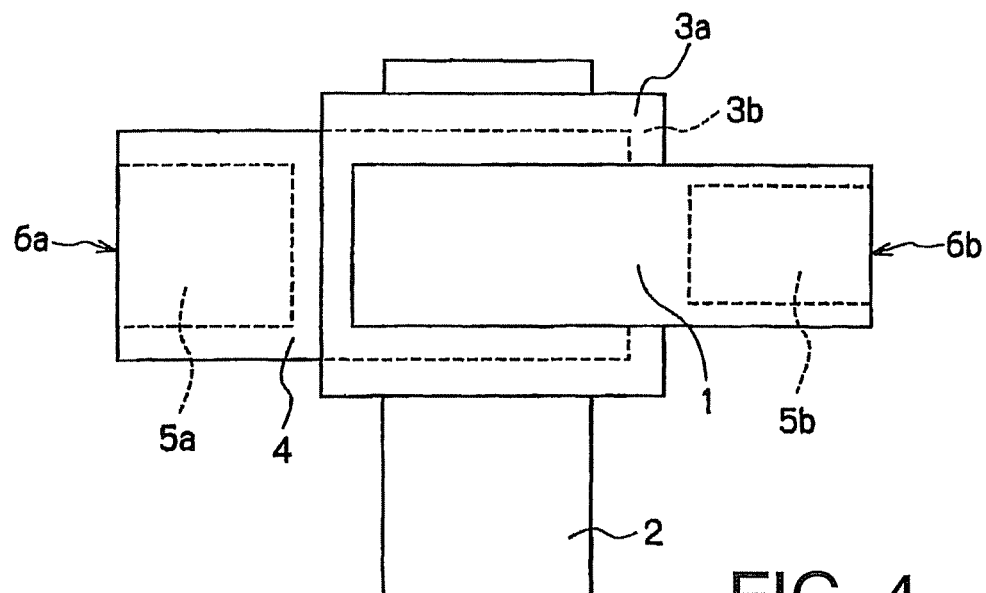
FIG. 4 is a plan view showing one embodiment of a vertical organic transistor with bus lines provided therein.
Figure 5:
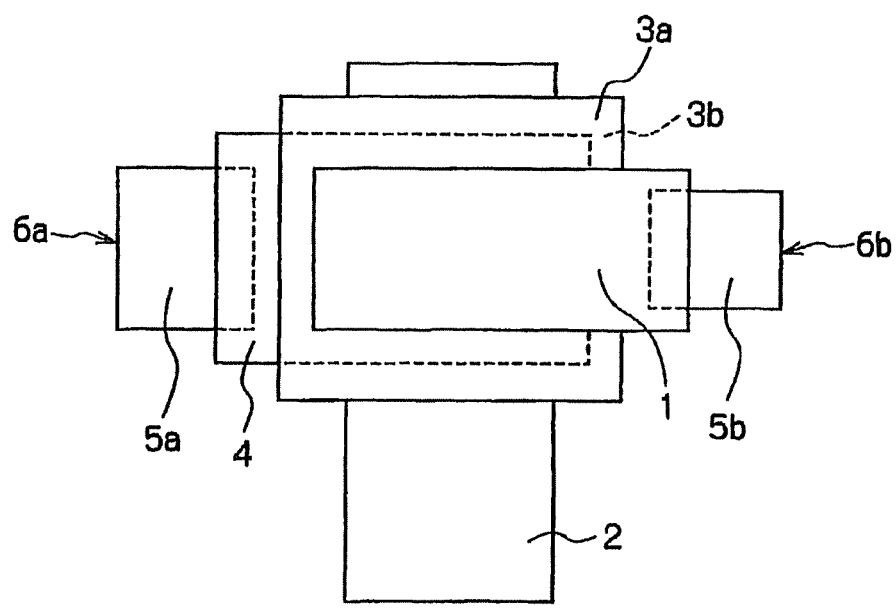
FIG. 5 is a plan view showing another one embodiment of a vertical organic transistor with bus lines provided therein.

FIG. 3 is a cross-sectional view showing one embodiment of a vertical organic transistor with bus lines provided therein. FIGS. 4 and 5 are plan views showing two embodiments of the vertical organic transistor with bus lines provided therein. In the present invention, as described above, the particulate metals 4a constituting the base electrode 4 (intermediate electrode) are thin. Therefore, particularly when the particulate metals 4a are formed thinly, the base electrode 4 has higher electric resistance than that in the conventional metal film. Consequently, when a contact part is provided in the base electrode 4, voltage drop occurs leading to a lowering in base voltage Vb applied to operating area A (here an area where the three electrodes overlap with one another in a plane view) that is likely to cause deteriorated current modulating properties. In this case, the provision of bus lines 5a, 5b as shown in FIGS. 3 to 5 is preferred.

Specifically, as shown in FIG. 3, the bus line 5a is provided on the base electrode 4 (intermediate electrode). When the bus line 5a is in contact with other electrodes (the emitter electrode 1 and the collector electrode 2), conduction (short-circuiting) or unnecessary leak current occurs. Therefore, the bus line 5a is provided so as to contact with only the base electrode 4. That is, preferably, the bus line 5a is provided at a site where the base electrode 4 does not overlap with the collector electrode 2 (lower electrode) in a plane view and at a site where the base electrode 4 (intermediate electrode) does not overlap with the emitter electrode 1 (upper electrode) in a plane view. In FIG. 3, the bus line 5a is provided between the substrate 1 and the base electrode 4 so that the bus line 5a is in contact with the base electrode 4. When the end of the bus line 5a is used as the contact part 6a, voltage drop can be prevented unlike the case where the end of the base electrode 4 (intermediate electrode) is used as the contact part. Accordingly, a lowering in the base voltage Vb applied to the operating area A can be prevented, and a deterioration in current modulating properties can be prevented.

When the bus line 5a and other electrodes (the emitter electrode 1 and the collector electrode 2) not in contact with each other, but are located very near each other, current is likely to flow in a layer surface direction through the organic semiconductor layer 3b. The leakage of current after passage through the bus line into other electrode can be prevented by forming the bus line 5a and other electrodes (the emitter electrode 1 and the collector electrode 2) while providing a space of, for example, about 20 μm between the bus line 5a and the other electrodes (the emitter electrode 1 and the collector electrode 2).

Further, for example, when the vertical organic transistor is used as a top emission-type light emitting organic transistor, the surface resistance of the upper electrode 1 is sometimes high. In this case, preferably, the bus line 5b as shown in FIG. 3 is also provided in the upper electrode 1 having the high surface resistance. The bus line 5b in this case is provided in contact with only the upper electrode 1 for the same reason as described above in connection with the bus line 5a provided on the base electrode 4. Specifically, preferably, the bus line 5b is provided at a site where the upper electrode 1 does not overlap with the lower electrode 2 in a plane view and at a site where the upper electrode 1 does not overlap with the intermediate electrode 4 in a plane view. In FIG. 3, the bus line 5b is provided between the substrate 1 and the upper electrode 1 so as to contact with the upper electrode 1. When the end of the bus line 5b is used as the contact part 6b, voltage drop can be prevented unlike the case where the end of the upper electrode 1 is used as the contact part. Accordingly, a lowering in the voltage applied to the operating area A can be prevented. The spacing between the bus line 5b and the other electrodes may be the same as described above in connection with the bus line 5a.

Preferably, the bus line 5a is formed of any material having good electroconductivity selected from metals, oxide semiconductors, and electroconductive polymers. Specifically, preferably, in the provision of the bus line 5a, a highly electroconductive material, for example, a metal film such as an aluminum (Al) film, an oxide semiconductor such as ITO, an electroconductive polymer such as PEDOT (manufactured by H.C. Starck Inc.) is used, and, for example, the thickness of the bus line 5a is regulated.

FIGS. 4 and 5 are plan views showing two respective embodiments of the vertical organic transistor with bus lines formed therein. The forms of the bus lines 5a, 5b are not limited to those in the embodiments shown in the drawings. For example, in the embodiments shown in FIGS. 3 to 5, the bus line 5a is provided between the substrate 10 and the intermediate electrode 4, and the bus line 5b is provided between the substrate 10 and the upper electrode 1. The bus line 5a may be provided on the intermediate electrode 4, and the bus line 5b may be provided on the upper electrode 1. The provision of the bus lines 5a, 5b on the substrate 10 can advantageously realize, for example, the formation of an electrode material such as ITO in a pattern form simultaneously with the formation of the lower electrode 2, contributing to a reduction in a working process.

Thus, the provision of the bus lines 5a, 5b having high electroconductivity on the intermediate electrode 4 and the upper electrode 1 that are very thin and have higher electric resistance than conventional metals can prevent voltage drop and can suppress a deterioration in current modulating properties.

[Method for Manufacturing Vertical Organic Transistor]

The method for manufacturing the vertical organic transistor 11 will be described. The method for manufacturing a vertical organic transistor according to the present invention comprises the steps of: forming a lower organic semiconductor layer 3b on a substrate 10 with a collector electrode 2 (a lower electrode) formed thereon; forming a layered continuous body 4 comprising a continuous insulating metal compound 4b and particulate metals 4a distributed within the insulating metal compound 4b on the lower organic semiconductor layer 3b; forming an upper organic semiconductor layer 3a on the layered continuous body 4; and forming an emitter electrode 1 on the upper organic semiconductor layer 3a. Each of the steps will be described. The description overlapped with the above description in connection with the "vertical organic transistor" will be omitted as needed.

(Step of Forming Lower Organic Semiconductor Layer)

This step comprises forming a lower organic semiconductor layer 3b on a substrate 10 with a collector electrode 2 (a lower electrode) formed thereon. At the outset, the substrate 10 will be described. As shown in FIG. 1, the vertical organic transistor 11 is provided on the substrate 10. The type and structure of the substrate 10 are not particularly limited, and any desired material selected, for example, from various materials such as metals such as Al, glass, quartz, or resins may be used in the substrate 10.

When the vertical organic transistor 11 is used in combination with a light emitting element part to constitute a light emitting element which will be described later, in the case of a light emitting element having a bottom emission structure where light emitted from the organic light emitting layer exits from the substrate 10 side, preferably, the substrate 10 is formed of a transparent or semitransparent material. In the case of a light emitting element having a top emission structure where light emitted from the organic light emitting layer exits from the opposite side of the substrate 10, the substrate 10 may not be necessarily formed of the transparent or semitransparent material and may be formed of an opaque material. In this case, in particular, materials commonly used as the substrate in organic EL elements, that is, materials that can support the strength of the organic EL element, are preferred. For example, a flexible material or a hard material may be selected as the material for the substrate 10 depending upon applications. Examples of specific materials usable herein include glass, quartz, polyethylene, polypropylene, polyethylene terephthalate, polymethacrylate, polymethylmethacrylate, polymethylacrylate, polyester, and polycarbonate. The substrate 10 may be in a sheet form or a continuous form, and examples of specific forms include cards, films, disks, and chips.

Any proper method for forming the collector electrode 2 on the substrate 10 may be selected, for example, from vacuum vapor deposition, sputtering, CVD, coating and the like while taking into consideration, for example, the exemplified materials for the collector electrode 2 and the type and heat resistance of the substrate 10. In general, for example, glass substrates with ITO and plastic substrates with ITO are preferred.

Any proper method for the formation of the lower organic semiconductor layer 3b on the collector electrode 2 may be selected, for example, from coating and vapor deposition while taking into consideration, for example, the material and properties of the exemplified organic semiconductor materials. In this case, the thickness and the like are also as described above.

(Step of Forming Layered Continuous Body)

Figure 6:
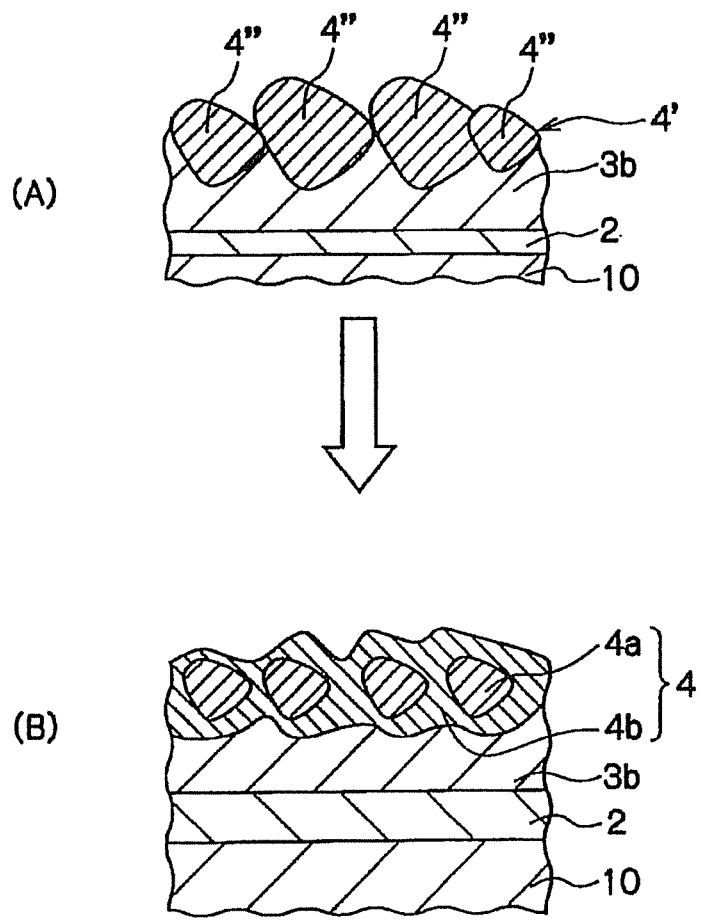
FIG. 6 is an explanatory view showing the step of forming a layered continuous body.

This step is the step of forming a layered continuous body 4 on the lower organic semiconductor layer 3b. The layered continuous body 4 comprises a continuous insulating metal compound 4b and particulate metals 4a distributed within the insulating metal compound 4b. Specifically, as shown in FIG. 6, the step of forming the layered continuous body 4 comprises a metal film forming step of forming a metal film 4' on the whole area on the lower organic semiconductor layer 3b (see FIG. 6 (A)) and a partially insulating step of partially insulating the metal film 4' to produce the continuous insulating metal compound 4b and the particulate metals 4a distributed within the insulating metal compound 4b (see FIG. 6(B)). According to this step, as with the case described above, the layered continuous body 4 produced by the metal film forming step and the partially insulating step can easily be produced, for example, by the production of the insulating metal compound 4b, for example, through a chemical reaction after the formation of the metal film 4'. Consequently, the manufacturing cost of the vertical organic transistor 11 can be lowered.

As shown in FIG. 6 (A), the metal film forming step is the step of forming a metal film 4' on the whole area on the lower organic semiconductor layer 3b. In this step, the metal film 4' may be formed by film forming means such as vacuum vapor deposition or sputtering using the material for constituting the particulate metals 4a. The form of the metal film 4' is not particularly limited and may be such that, in the subsequent partially insulating step, the particulate metals 4a are distributed within the insulating metal compound 4b. In particular, preferably, the metal film 4' is an agglomerate of metallic particles 4" having a diameter of not less than 5 nm and not more than 200 nm, preferably not less than 10 nm and not more than 40 nm. In the metal film 4' formed of the metallic particles 4" in the above-defined particle diameter range, the thickness of the film on the periphery of the metallic particles 4" is so small that the film can easily be converted to the insulating metal compound 3b, for example, by a chemical reaction, and the average diameter of the particulate metals 4a can be brought to not less than 5 nm and not more than 200 nm. Consequently, a transparent part for current which flows across the emitter electrode 1 and the collector electrode 2 can easily be formed, and, thus, the manufacturing cost of the vertical organic transistor 11 can be lowered.

As described above, the partially insulating step is carried out until the average diameter of the particulate metals 4a reaches not less than 5 nm and not more than 200 nm. Specifically, the metal film 4' formed of the metallic particles 4" as shown in FIG. 6 is allowed to chemically react in a reactive gas, and the reaction is continued until the average diameter of the particulate metals 4a as shown in FIG. 6(B) reaches the above-defined range. Reactive gas atmospheres for the chemical reaction include oxygen atmosphere, oxygen-nitrogen mixed atmosphere, and highly-humid atmosphere. Among them, the oxygen atmosphere is preferred because oxidation treatment can easily be carried out. The insulating metal oxide 4b can easily be formed around the metallic particles 4" by oxidizing the metal film 4' formed of the agglomerate of the metallic particles 4", and the insulating metal compound 4b can function as a transparent part for current which flows between the emitter electrode 1 and the collector electrode 2.

When the average diameter of the particulate metals 4a is allowed to fall within a predetermined range by the partially insulating step, the average diameter of the particulate metals 4a can be reduced to a much smaller value than the width of the metal layer as the base electrode in the prior art technique. Accordingly, the insulating metal compound 4b which is provided around the particulate metals 4a and functions as the current transparent part can easily be produced in a larger amount (at higher density) within the layered continuous body 4.

(Step of Forming Upper Organic Semiconductor Layer)

This step is the step of forming an upper organic semiconductor layer 3a on the layered continuous body 4. Any proper method for the formation of the upper organic semiconductor layer 3a on the layered continuous body 4 may be selected, for example, from coating and vapor deposition while taking into consideration, for example, the material and properties of the exemplified organic semiconductor materials. In this case, the thickness and the like are also as described above.

(Step of Forming Upper Electrode)

This step is the step of forming an emitter electrode 1 on the upper organic semiconductor layer 3a. Any proper method for forming the emitter electrode 1 on the upper organic semiconductor layer 3a may be selected, for example, from vacuum vapor deposition, sputtering, and CVD while taking into consideration, for example, the exemplified materials for the emitter electrode 1 and the type and heat resistance of the upper organic semiconductor layer 3a.

The vertical organic transistor 11 is manufactured through these steps. If necessary, a protective layer formed of PVP (polyvinylpyrrolidone) or the like or a gas barrier layer formed of silicon oxide, silicon oxynitride or the like may be formed on the emitter electrode 1.

The method for manufacturing a vertical organic transistor according to the present invention comprises the step of forming the layered continuous body 4 on the lower organic semiconductor layer 3b. In the layered continuous body 4 formed in this step, the part formed of the particulate metals 4a functions as the pattern etched intermediate electrode (base electrode) while the part formed of the insulating metal compound 4b in which the particulate metals 4a are absent functions as the opening in the prior art technique. In the layered continuous body 4 in the above form, the part defined by the insulating metal compound 4b which functions as the opening functions as the transparent part for current which flows across the emitter electrode 1 (upper electrode) and the collector electrode 2 (lower electrode). The adoption of this method can realize easy formation of the insulating metal compound 4b, for example, by a chemical reaction, for example, after the formation of a thin metal film (metal film 4'). Accordingly, the manufacturing cost of the vertical organic transistor can be lowered.

The vertical organic transistor 11 thus manufactured can function as a transistor that can realize large current modulation at low voltage. Therefore, the vertical organic transistor 11 is suitable, for example, as a driving transistor that is a switching element constituting a light emitting element 21 which will be described later.

[Light Emitting Element]

Figure 7:
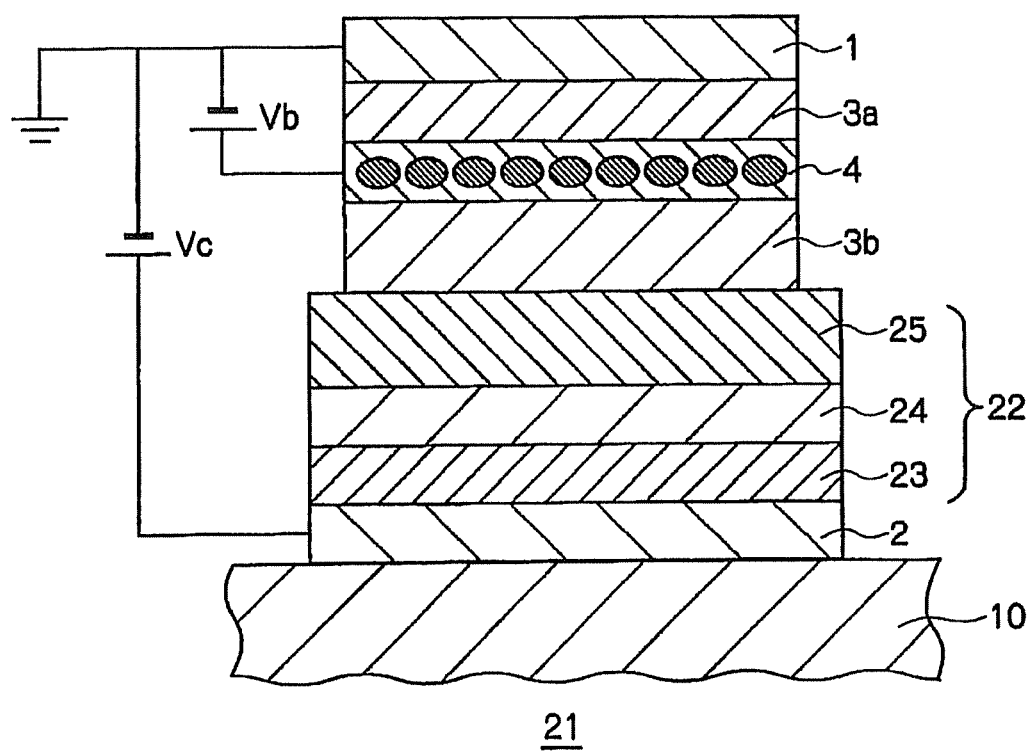
FIG. 7 is a typical cross-sectional view showing the configuration of one embodiment of a light emitting element according to the present invention.

Next, the light emitting element will be described. FIG. 7 is a typical cross-sectional view showing the configuration of one embodiment of the light emitting element according to the present invention. The light emitting element 21 according to the present invention exemplified in FIG. 7 comprises a light emitting element part 22 and a vertical organic transistor 11 that are provided on a substrate 10. The light emitting element part 22 is provided between an anode (a collector electrode 2) and a cathode (an emitter electrode 1) and comprises an organic light emitting layer 25. The vertical organic transistor 11 is provided between the emitter electrode 1 and the collector electrode 2 and comprises an organic semiconductor 3 (3a, 3b) and a layered continuous body 4 provided within the organic semiconductor 3. More specifically, the light emitting element 21 comprises the substrate 10 and the collector electrode 2, the light emitting element part 22, the lower organic semiconductor layer 3b, the layered continuous body 4, the upper organic semiconductor layer 3a, and the emitter electrode 1 stacked in that order, as viewed from the substrate 10, on the substrate 10. Regarding the electrodes that apply charges to the light emitting element part 22, in the embodiment shown in FIG. 7, the collector electrode 2 functions as an anode and injects holes into a hole injection layer 23, and the emitter electrode 1 functions as a cathode and injects electrons into the upper organic semiconductor layer 3a. For the light emitting element 21, elements other than the vertical organic transistor 11 will be described.

(Light Emitting Element Part)

As shown in FIG. 7, the light emitting element part 22 is provided between the collector electrode 2 and the lower organic semiconductor layer 3b. Specifically, the light emitting element part 22 comprises a hole injection layer 23, a hole transport layer 24, and an organic light emitting layer 25 stacked in that order as viewed from the collector electrode 2. The light emitting element part 22 comprises the organic light emitting layer 25 as an indispensable element, and one or more layers selected from the hole injection layer 23, the hole transport layer 24, an electron transport layer, and an electron injection layer may be optionally provided. That is, the configuration of the light emitting element part 22 is not limited to that shown in FIG. 7. Further, a charge block layer, for example, a hole block layer or an electron block layer, which prevents carriers (holes or electrons) from going through the layer and allows carries to be efficiently recombined may be provided as other layer.

Materials for the formation of the hole injection layer 23 include, for example, in addition to the compounds exemplified above in connection with the light emitting materials for the organic light emitting layer 25, oxides, for example, phenylamine-based oxides, starburst amine-based oxides, phthalocyanine-based oxides, vanadium oxide, molybdenum oxide, ruthenium oxide, aluminum oxide, and derivatives, for example, amorphous carbon, polyaniline, and polythiophene.

Materials commonly used as hole transport materials may be used as materials for the formation of the hole transport layer 24, and examples thereof include phthalocyanine, naphthalocyanine, porphyrin, oxadiazole, triphenylamine, triazole, imidazole, imidazolone, pyrazoline, tetrahydroimidazole, hydrazone, stilbene, pentacene, polythiophene, or butadiene, or their derivatives. Further, materials commercially available as materials for the formation of the hole transport layer 24 may also be used, and examples thereof include poly(3,4)ethylenedloxythiophene/polystyrenesulfonate (abbreviated to PEDOT/PSS, manufactured by Bayer Corporation, tradename; Baytron P AI4083, commercially available as aqueous solution). The hole transport layer 24 may be formed using a coating liquid for hole transport layer formation containing the compound. The hole transport material may be mixed into the organic light emitting layer 25 or alternatively may be mixed into the hole injection layer 23.

Any material commonly used for the formation of a light emitting layer in organic EL elements may be used without particular limitation as the material for organic light emitting layer 25 formation, and examples thereof include coloring matter-based light emitting materials, metal complex-based light emitting materials, and polymer-based light emitting materials.

Coloring matter-based light emitting materials include, for example, cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perinone derivatives, perylene derivatives, oligothiophene derivatives, trifumanylamine derivatives, oxadiazole dimers, and pyrazoline dimers.

Metal complex-based light emitting materials include, for example, aluminum quinolinol complexes, benzoquinolinol beryllium complexes, benzooxazol zinc complexes, benzothiazole zinc complexes, azomethyl zinc complexes, porphyrin zinc complexes, and europium complexes, and metal complexes comprising, for example, Al, Zn, Be, or a rare earth metal such as Tb, Eu, or Dy as a central metal and, for example, an oxadiazole, thiadiazole, phenylpyridine, phenylbenzoimidazole, or quinoline structure as a ligand.

Polymer-based light emitting materials include, for example, polyparaphenylene vinylene derivatives, polythiophene derivatives, polyparaphenylene derivatives, polysilane derivatives, polyacetylene derivatives, polyvinylcarbazole, polyfluorenone derivatives, polyfluorene derivatives, polyquinoxaline derivatives, and their copolymers.

Additives such as doping agents may be added into the organic light emitting layer 25, for example, from the viewpoints of improving luminescence efficiency and changing luminescence wavelength. Doping agents include, for example, perylene derivatives, coumalin derivatives, rubrene derivatives, quinacridone derivatives, squallum derivatives, porphyrin derivatives, styryl dyes, tetracene derivatives, pyrazoline derivatives, decacyclene, phenoxazone, quinoxaline derivatives, carbazole derivatives, and fluorene derivatives.

In the embodiment shown in FIG. 7, the lower organic semiconductor layer 3b and the upper organic semiconductor layer 3a function as the electron transport layer. The material for electron transport layer formation is as described above and thus will be omitted. The material for electron transport layer formation may be mixed into the organic light emitting layer 25.

The electron injection layer not shown in FIG. 7 may be provided between the emitter electrode 1 and the upper organic semiconductor layer 3a. Materials usable for electron injection layer formation include, for example, alkali metals, halides of alkali metals, and organic complexes of alkali metals, for example, aluminum, lithium fluoride, strontium, magnesium oxide, magnesium fluoride, strontium fluoride, calcium fluoride, barium fluoride, aluminum oxide, strontium oxide, calcium, sodium polymethylmethacrylate polystyrene sulfonate, lithium, cesium, and cesium fluoride.

Each of the layers may be formed, for example, by vacuum vapor deposition or by dissolving or dispersing materials for the layer formation in a solvent such as toluene, chloroform, dichloromethane, tetrahydrofuran, or dioxane to prepare a coating liquid and, for example, coating or printing the coating liquid with a coating device or the like.

If necessary, an excitation block layer which functions as a hole block layer, an electron block layer and the like may be provided. The excitation block layer prevents the passage of carriers (holes and electrons) through the organic light emitting layer 25 and efficiently recombines the carriers. For example, the provision of the hole block layer on the organic light emitting layer 25 on its side proximal to the collector electrode 2, or the provision of the electron block layer on the organic light emitting layer 25 on its side proximal to the emitter electrode 1 can prevent the passage of holes or electrons injected from each electrode through the organic light emitting layer 25. BCP (1-bromo-3-chloropropane) may be mentioned as an example of the material for the excitation block layer formation.

An equipotential layer (not shown) may be provided so that current output from the vertical organic transistor 11 can be applied evenly to the surface of the light emitting element part 22. In the embodiment shown in FIG. 7, the equipotential layer may be provided, for example, between the organic light emitting layer 25 and the lower organic semiconductor layer 3b. The equipotential layer is preferably formed of a material having low specific resistance, for example, a metallic material such as Al, Ag, Au, or Cr.

As described above, the light emitting element 21 according to the present invention comprises the vertical organic transistor 11 that can significantly modulate the amount of current which flows across the emitter electrode 1 and the collector electrode 2. Accordingly, the modulated current can be applied as a light emitting current to the organic light emitting layer 25 provided between the emitter electrode 1 which functions as the cathode and the collector electrode 2 which functions as the anode. As a result, for example, the controllability of luminescence brightness of the organic light emitting layer 25 can be enhanced, and, at the same time, the cost can be lowered.

EXAMPLES

The present invention will be described in more detail with reference to various experiments. It should be noted that the present invention is not limited to the following Examples.

Experiment Example 1

A 1 mm-thick glass substrate with a 150 nm-thick transparent ITO electrode (collector electrode) formed thereon was provided. The glass substrate with the ITO electrode was set in a vacuum chamber. A perylene-based pigment (Me-PTC) was formed to a thickness of 200 nm by vapor deposition on the ITO electrode to form a lower organic semiconductor layer. A 20 nm-thick aluminum metal film was then formed by vacuum vapor deposition on the lower organic semiconductor layer. In this case, the vapor deposition rate was set in the range of 0.1 nm/sec to 1 nm/sec so that the metal film is formed of a number of metallic particles (grains) having an average diameter of 30 nm. The film was actually formed at a vapor deposition rate of 1 nm/sec. The element with the aluminum metal film formed thereon (see FIG. 6 (A)) was held in an environment heated at 120° C. under the atmospheric environment to oxidize the periphery of the metallic particles constituting the aluminum metal film and thus to form a layered continuous body comprising particulate aluminum metals and aluminum oxide (see FIG. 6 (B)). The element was again returned to the vacuum chamber, and fullerene C60 was then vapor deposited to a thickness of 40 nm to form an upper organic semiconductor layer. Further, silver (Ag) was vapor deposited to form an emitter electrode, and the assembly was subjected to sealing treatment under a nitrogen atmosphere. The sealing treatment was performed by laminating two glasses with a ultraviolet curable resin. Thus, a vertical organic transistor of Experiment Example 1 was manufactured.

Figure 8:
FIG. 8 is a TEM image showing a sectional form of a layered continuous body.
Figure 8:

FIG. 8 (A) is a TEM image showing a sectional form of a layered continuous body, and FIG. 8 (B) is an oxygen mapping image. As can be seen from these photographs, the aluminum oxide constituting the layered continuous body is in such a form that the aluminum metal in a particulate form is distributed within the aluminum oxide.

Experiment Example 2

A vertical organic transistor of Experiment Example 2 was manufactured in the same manner as in Experiment Example 1, except that the element with the aluminum metal film formed thereon was held at 25° C. under the atmospheric environment without heating.

Experiment Example 3

A vertical organic transistor of Experiment Example 3 was manufactured in the same manner as in Experiment Example 1, except that the element with the aluminum metal film formed thereon was held under a nitrogen gas atmosphere heated at 120° C.

Experiment Example 4

A vertical organic transistor of Experiment Example 4 was manufactured in the same manner as in Experiment Example 1, except that the element with the aluminum metal film formed thereon was held at 25° C. under the nitrogen gas atmosphere without heating.

(Effect on Current Modulation)

Figure 9:
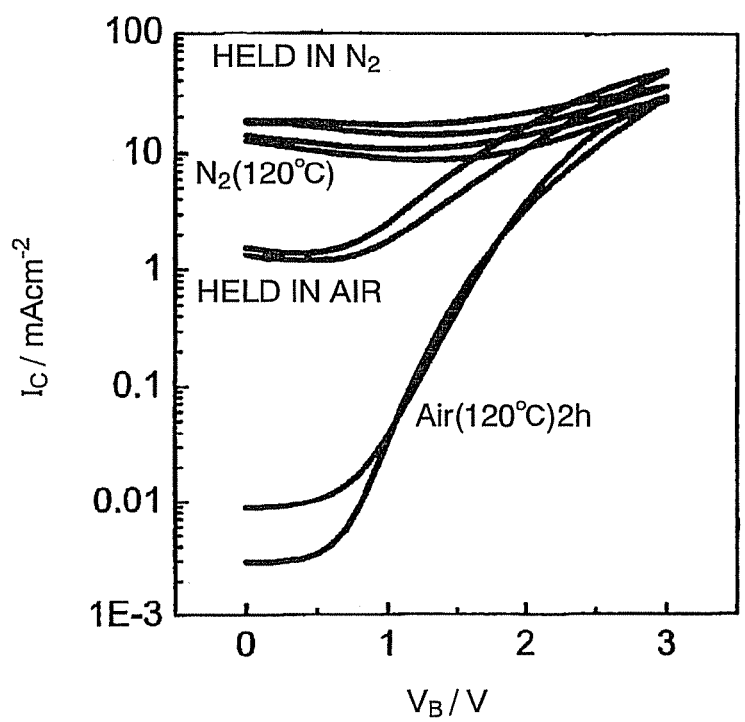
FIG. 9 is a graph for explaining the influence of collector current on current modulation in vertical organic transistors comprising layered continuous bodies formed in different gas atmospheres.

The effect of the layered continuous body formed in various gas atmospheres on the modulation of the collector current was examined using the vertical organic transistors manufactured in Experiment Examples 1 to 4. FIG. 9 is a graph showing the results of the examination. The effect was measured by providing two source measure units and measuring collector current and base current when the base voltage was varied in such a state that a given collector voltage was applied. The base electrode is very thin and is in a particulate metal form in the layered continuous body due to the heat treatment. Accordingly, the base electrode has much higher electric resistance than the conventional metal film. This leads to a voltage drop in the wiring part which in turn decreases the base voltage applied to an operating region, resulting in lowered current modulating properties. Therefore, in order to avoid an increase in electric resistance of the base electrode, the measurement was performed using a sample in which ITO was previously formed and extended as a bus line to a part around the operating region A in the preparation of the lower electrode (see FIGS. 3 and 4).

As shown in FIG. 9, for the vertical organic transistors of Experiment Examples 1 and 2 wherein the aluminum metal film was held under the atmospheric environment, current modulation upon scanning of the voltage Vb was confirmed. In particular, for the vertical organic transistor of Experimental Example 1 where aluminum metal film was heated to 120° C., a high level of current modulation was confirmed. On the other hand, for the vertical organic transistors of Experiment Examples 3 and 4 where the aluminum metal film was held under a nitrogen atmosphere, current modulation was not observed. The results suggest that, for Experiment Examples 1 and 2, the aluminum metal film was converted to insulating aluminum oxide to constitute such a form that particulate aluminum metals were present within the aluminum oxide (see FIG. 8), whereby the aluminum oxide located among the particulate aluminum metals functioned as a transparent part (opening) through which current passed. On the other hand, for Experiment Examples 3 and 4, it is considered that the aluminum metal film was held under a non-oxidizing nitrogen atmosphere and thus remained unconverted to the insulating aluminum oxide, and, consequently, the current transparent part (opening) was not formed.

Experiment Example 5

Figure 10:
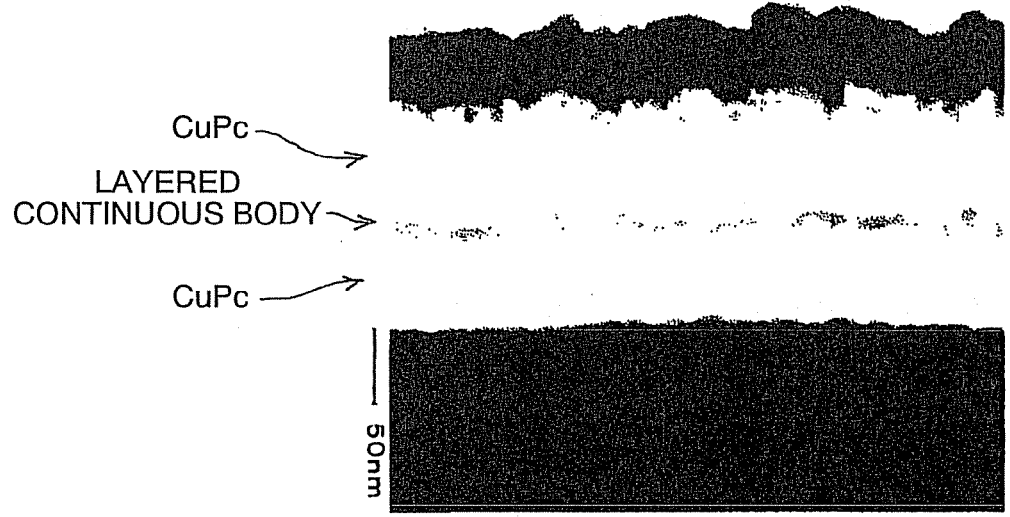
FIG. 10 is a TEM image showing a sectional form of a layered continuous body.
Figure 11:
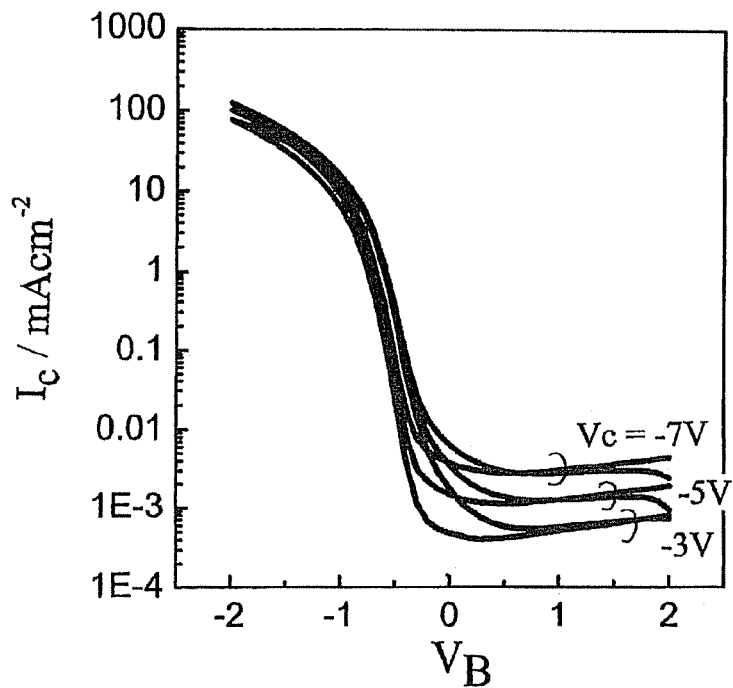
FIG. 11 is a graph showing current modulating properties of a vertical organic transistor of Example 5.
Figure 12:
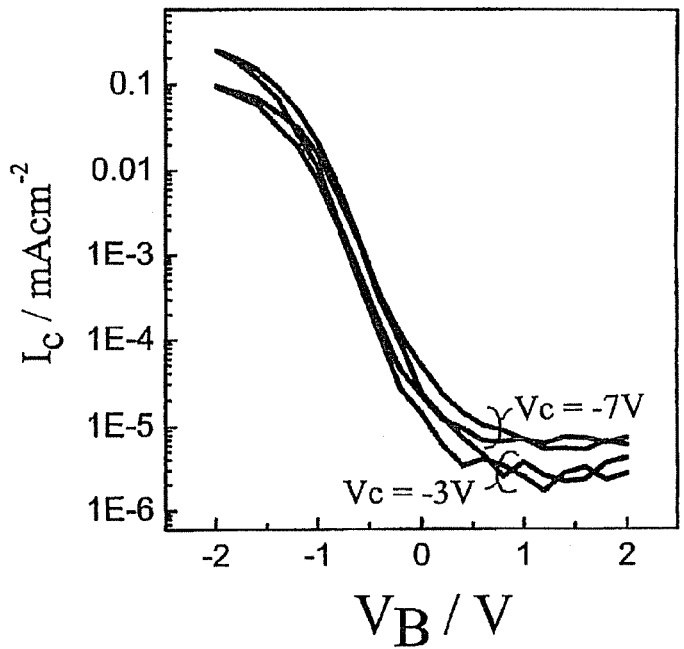
FIG. 12 is a graph showing current modulating properties of a vertical organic transistor of Example 7.
Figure 13:
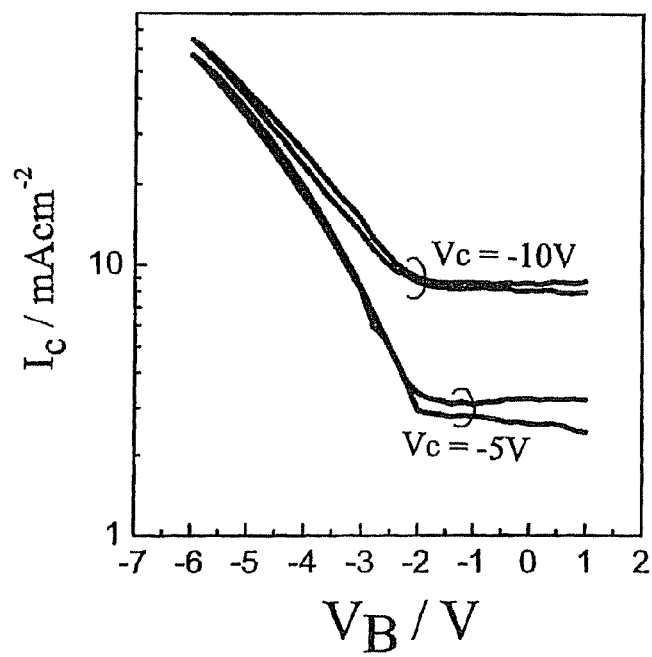
FIG. 13 is a graph showing current modulating properties of a vertical organic transistor of Example 8.
Figure 14:
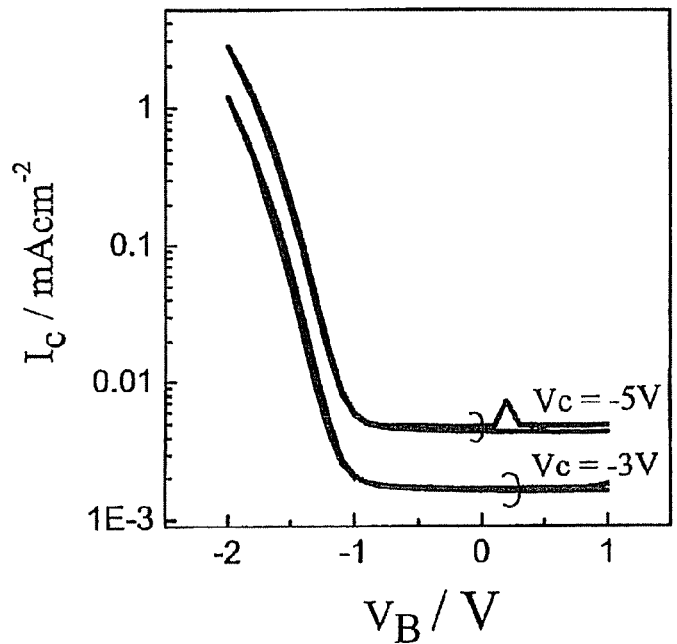
FIG. 14 is a graph showing current modulating properties of a vertical organic transistor of Example 9.

A vertical organic transistor of Experiment Example 5 was manufactured in the same manner as in Experiment Example 1, except that a 100 nm-thick layer of CuPc was formed as the lower organic semiconductor layer by vapor deposition instead of the 200 nm-thick layer of the perylene-based pigment (Me-PTC) and, further, a 60 nm-thick layer of pentacene was formed as the upper organic semiconductor layer by vapor deposition instead of the 40 nm-thick layer of C60. A TEM image in a cross-sectional form of the layered continuous body obtained in this case is shown in FIG. 10. Also in this case, it was confirmed that particulate metals (metal grains) were present within the layered continuous body as the intermediate electrode.

Experiment Example 6

A vertical organic transistor of Experiment Example 6 was manufactured in the same manner as in Experiment Example 1, except that the thickness (200 nm) of the lower organic semiconductor layer of the perylene-based pigment (Me-PTC) formed by vapor deposition was changed to 100 nm.

Experiment Example 7

A vertical organic transistor of Experiment Example 7 was manufactured in the same manner as in Experiment Example 1, except that a 100 nm-thick layer of pentacene was formed as the lower organic semiconductor layer by vapor deposition instead of the 200 nm-thick layer of the perylene-based pigment (Me-PTC) and, further, a 60 nm-thick layer of pentacene was formed as the upper organic semiconductor layer by vapor deposition instead of the 40 nm-thick layer of C60.

Experiment Example 8

A vertical organic transistor of Experiment Example 8 was manufactured in the same manner as in Experiment Example 1, except that an 80 nm-thick layer of NPD was formed as the lower organic semiconductor layer by vapor deposition instead of the 200 nm-thick layer of the perylene-based pigment (Me-PTC), the thickness of the aluminum metal film was changed to 8 nm, a 60 nm-thick layer of NPD was further formed as the upper organic semiconductor layer by vapor deposition instead of the 40 nm-thick layer of C60, and the temperature of heating under the atmospheric environment was changed to 60° C.

Experiment Example 9

A vertical organic transistor of Experiment Example 9 was manufactured in the same manner as in Experiment Example 1, except that an 100 nm-thick layer or poly-3-hexylthiophene was formed as the lower organic semiconductor layer by spin coating instead of the 200 nm-thick layer of the perylene-based pigment (Me-PTC), the thickness of the aluminum metal film was changed to 6 nm, a 30 nm-thick layer of poly-3-hexylthiophene was further formed as the upper organic semiconductor layer by spin coating instead of the 40 nm-thick layer of C60, and the temperature of heating under the atmospheric environment was changed to 80° C.

(Evaluation of Gain)

The current modulating properties of the vertical organic transistors manufactured in Experiment Examples 1 and 5 to 9 were measured in the same manner as used in FIG. 9. The results are shown in FIGS. 11 to 14. The vertical organic transistors of Examples 1 and 6 are an n-type material. On the other hand, the vertical organic transistors of Examples 5 and 7 to 9 are a p-type material. Accordingly, both types of the vertical organic transistors are opposite to each other in bias direction of the current modulating properties. This, however, is not an essential difference for the present invention. The amount of change in the collector current against the amount of change in the base current was defined as a gain, and the maximum gain was calculated based on the obtained results. As a result, the gain was not less than 1000 for Experiment Example 1, 200 to 300 for Experiment example 5, 100 to 200 for Experiment Example 6, and 0.1 to 10 for Experiment Examples 7, 8, and 9. The results show that only proper grains (particulate metals) can effectively function as the base electrode.

Experiment Example 10

A light emitting element was manufactured. At the outset, a 1 mm-thick glass substrate with a 150 nm-thick transparent ITO electrode (collector electrode) provided thereon was provided. A 5 nm-thick hole injection layer formed of CuPc was formed on the ITO electrode in the glass substrate with the ITO electrode. A 30 nm-thick hole transport layer formed of NPD was then formed by vacuum vapor deposition on the hole injection layer. A 50 nm-thick organic light emitting layer formed of $Alq_3$ was then formed by vacuum vapor deposition on the hole transport layer. Subsequently, a lower organic semiconductor layer formed of a perylene-based pigment (Me-PTC) was formed on an excitation block layer provided on the organic light emitting layer in the same manner as in Experiment Example 1. An aluminum metal film was then formed and was oxidized to form a layered continuous body. Further, a 40 nm-thick upper organic semiconductor layer formed of fullerene C60 and an emitter electrode formed of a vapor deposited Ag film were formed, followed by sealing treatment under a nitrogen atmosphere to manufacture a light emitting element of Experiment Example 10. The sealing treatment was performed in the same manner as in Experiment Example 1.

The light emitting element thus obtained emitted no light when a base voltage of 0 V was applied, while, when a base voltage of 1 V was applied, green light was emitted from the light emitting element.

The invention claimed is:

1. A vertical organic transistor comprising an upper electrode, a lower electrode, an organic semiconductor provided between both the electrodes, and an intermediate electrode provided within the organic semiconductor,
   wherein the intermediate electrode comprises a layered continuous body comprising a continuous insulating metal compound and particulate metals distributed within the insulating metal compound, and
   wherein the insulating metal compound is an oxide of the same metal as the particulate metals.

2. The vertical organic transistor according to claim 1, wherein the average diameter of the particulate metals is not less than 5 nm and not more than 200 nm.

3. The vertical organic transistor according to claim 1, wherein the particulate metals are formed of aluminum or copper.

4. The vertical organic transistor according to claim 1, wherein the organic semiconductor comprises a lower organic semiconductor layer located between the intermediate electrode and the lower electrode and an upper organic semiconductor layer located between the intermediate electrode and the upper electrode.

5. The vertical organic transistor according to claim 1, wherein a bus line is provided on the intermediate electrode.

6. The vertical organic transistor according to claim 5, wherein the bus line is provided at sites where the intermediate electrode does not overlap with the lower electrode or the upper electrode in a plane view.

7. The vertical organic transistor according to claim 5, wherein the bus line is formed of any material selected from metals, oxide semiconductors, and electroconductive polymers.

8. The vertical organic transistor according to claim 1, wherein a bus line is provided on the upper electrode.

9. The vertical organic transistor according to claim 8, wherein the bus line is provided at sites where the upper electrode does not overlap with the lower electrode or the intermediate electrode in a plane view.

10. A light emitting element comprising:
    a vertical organic transistor according to claim 1; and
    a light emitting element part comprising an organic light emitting layer provided between the upper electrode and the lower electrode that constitute the vertical organic transistor.

11. The light emitting element according to claim 10, wherein the light emitting element part comprises one or more layers selected from a hole transport layer, an electron transport layer, a hole injection layer, and an electron injection layer, and the organic light emitting layer is an organic electroluminescent (EL) layer.

12. A method for manufacturing a vertical organic transistor; comprising an upper electrode, a lower electrode, an organic semiconductor provided between both the electrodes, and an intermediate electrode provided within the organic semiconductor, the organic semiconductor comprising an upper organic semiconductor layer on the upper electrode side and a lower organic semiconductor layer on the lower electrode side, wherein the method comprising the steps of:
    forming the lower organic semiconductor layer on a substrate with the lower electrode formed thereon;
    forming an intermediate electrode on the lower organic semiconductor layer, the intermediate electrode comprising a continuous insulating metal compound and particulate metals distributed within the insulating metal compound, wherein the insulating metal compound is an oxide of the same metal as the particulate metals;
    forming the upper organic semiconductor layer on the intermediate electrode; and
    forming the upper electrode on the upper organic semiconductor layer.

13. The method according to claim 12, wherein the step of forming the intermediate electrode comprises:
    a metal film forming step of forming a metal film on the whole area of the top of the lower organic semiconductor layer; and
    a partially insulating step of partially insulating the metal film to produce a continuous insulating metal compound and particulate metals distributed within the insulating metal compound.

14. The method according to claim 13, which further comprises a bus line forming step of forming a bus line connected to the upper electrode on the substrate at its sites where the upper electrode does not overlap with the lower electrode or the intermediate electrode in a plane view.

15. The method according to claim 13, wherein the partially insulating step is oxidation treatment in an oxygen atmosphere.

16. The method according to claim 13, wherein the metal film is formed of a composite of metallic particles with diameters of not less than 5 nm and not more than 200 nm.

17. The method according to claim 13, wherein the partially insulating step is carried out to such an extent that the average diameter of the particulate metals is brought to not less than 5 nm and not more than 200 nm.

18. The method according to claim 13, which further comprises a bus line forming step of forming a bus line connected to the intermediate electrode on the substrate at its sites where the intermediate electrode does not overlap with the lower electrode or the upper electrode in a plane view.

19. The method according to claim 18, wherein, in the bus line forming step, the bus line is formed from one or more materials selected from metals, oxide semiconductors, and electroconductive polymers.

* * * * *